United States Patent [19]

Sternbeck

[11] 4,013,971
[45] Mar. 22, 1977

[54] INTEGRATED AMPLIFIER
[75] Inventor: Olaf Sternbeck, Bromma, Sweden
[73] Assignee: Telefonaktiebolaget L M Ericsson, Stockholm, Sweden
[22] Filed: Nov. 19, 1975
[21] Appl. No.: 633,509
[30] Foreign Application Priority Data
 Dec. 4, 1974 Sweden .............................. 7415220
[52] U.S. Cl. .................................. 330/23; 330/28; 330/38 M; 357/51
[51] Int. Cl.² ......................................... H03F 3/04
[58] Field of Search .................... 330/23, 28, 38 M; 357/51

[56] References Cited
FOREIGN PATENTS OR APPLICATIONS
951,342 3/1964 United Kingdom ............. 330/23 X Primary Examiner—R. V. Rolinec
Assistant Examiner—Lawrence J. Dahl
Attorney, Agent, or Firm—Hane, Sullivan & Spiecens

[57] ABSTRACT

A monolitic transistor amplifier includes a negative feedback network between the output stage and an input stage. The network comprises one or more resistive voltage divider L-link with shunt elements which have a higher temperature coefficient than its series elements. The shunt elements have resistors which are in close thermal contact with the output transistor causing the negative feedback to increase with the current passing the output transistor. The shunt resistors are formed in the collector diffusion giving them a temperature coefficient of 3.5%/° C.

10 Claims, 4 Drawing Figures

INTEGRATED AMPLIFIER

The present invention relates to an integrated amplifier of the kind where the transmission of the output signal of the amplifier and the current supply to the amplifier pass through the same conductor.

In modern telephone sets microphones are more and more used which have better transmission qualities than presently available carbon microphones. These microphones have, however, the drawback that they generate considerably lower level signals than the signals which can be obtained from a carbon microphone. It is therefore necessary to supply each telephone set with an amplifier so that the microphone signal is not lost in the disturbances and noise on the line. These microphone amplifiers should be fed by current through the subscriber's line so there is no need for separate current sources in each telephone set.

Owing to the varying length of the subscriber's lines these amplifiers must operate within a wide range of supply current even if the terminal voltage of the station battery is constant. Assuming the usual voltages and normally approved variations in the line resistance the current can vary between 10 and 100 mA at different subscriber locations. Since an amplifier hardly works satisfactorily when the feeding voltage varies to that extent several solutions for current regulation have been proposed.

It is known to utilize an element with non-linear characteristics as primary voltage or current sensors in an amplifier regulation circuit. This non-linear element, which often is placed near the current feeding point of the circuit and thus also near the signal output of the amplifier, causes, however, a considerable non-linear distortion of the signal. In order to eliminate this distortion it is necessary that the signal currents by-pass the non-linear element by means of capacitors. These capacitors normally must have so large a capacitance, of the magnitude 1uF, that they have to be connected outside the substrate which contains the integrated circuit. Such exterior components, however, such be avoided for cost-, space- and reliability reasons.

One possibility to avoid exterior capacitors is to utilize the thermal conductance between two different integrated components on the same monolitic semiconductor chip. The thermal time constant between two circuit elements is of such a magnitude that it corresponds to a large capacitance at the impedance levels which are present in bipolar integrated circuits. It is known for example by the U.S. Pat. No. 3,440,352 to supply a microphone amplifier for telephony purposes with a thermally operating regulating circuit. This consists of a number of additional transistor stages including a separate transistor operating as a heating element and another transistor, which is thermally connected to the latter, serves as a regulator for the supply voltage of the amplifier. Here the temperature sensitivity of the emitter-base diode is utilized causing the base voltage required for a certain base current to be reduced by 2 mV/° C. If the regulator transistor is heated by a too high a line voltage it makes the output transistor of the amplifier conduct more causing the line voltage to fall again, thus the desired stabilization of the operating point of the amplifier is obtained. This solution of the problem requires, however, a couple of additional components only for stabilizing which makes the circuit more complicated and thus more expensive.

According to the invention it is possible to achieve an amplifier where automatic compensation of varying supply current is obtained without any additional components on or outside the integrated circuit. The characteristics of the invention appear from the accompanying claims.

The invention will be explained more in detail in connection to the accompanying drawings where:

Figure 1:
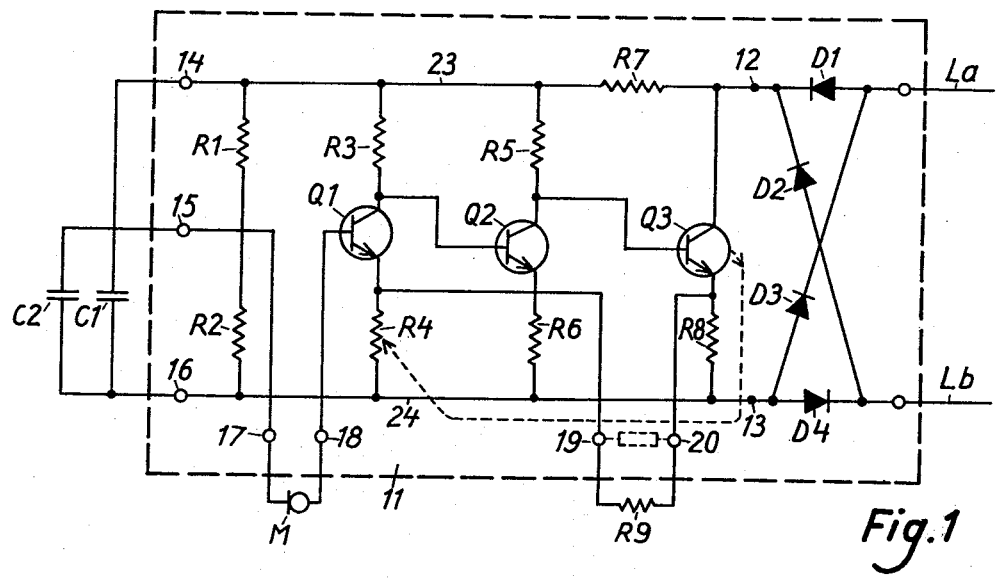
FIG. 1 shows a circuit diagram for an integrated microphone amplifier.

In FIG. 1 the dotted line 11 denotes the semi-conductor chip into which the amplifier is integrated. All the components which exist within this frame are thus integrated while the components which exist outside are discrete components. The integrated circuit as well as the discrete components are suitably mounted on a thick film substrate.

The incoming line La, Lb is connected to the amplifier through a diode bridge D1-D4, the task of which is to make the amplifier independent of the polarity of the line. The point 12 (transfer terminal) is thus always positive, while the point 13 (transfer terminal) is negative. These points 12, 13 constitute current supply terminals as well as output terminals in the amplifier.

The amplifier comprises three direct coupled transistor stages (solid state amplifiers) Q1, Q2 and Q3. The transistor Q3 of the final stage has the collector (output electrode) connected directly to the output 12 while the emitter (reference electrode) is connected to the output 13 through the emitter resistor R8. The output transistor Q3 is thus passed by the line DC which is modulated by the speech signal. Since the voltage of point 12 thus will be modulated by the speech signal the current supply to the low-level stages Q1 and Q2 is taken from a point 23 which is AC decoupled by the series resistor R7 and the capacitor C1 to prevent the output signal from being fed back to the previous stages.

The microphone M (means for applying AC signals) which can be of the electromagnetic type is connected between the base (control electrode) of the transistor Q1 and the point 15 in the voltage divider R1, R2 connected between the points 23 and 13. The resistor R2 is shunted by a capacitor C2. The collector of the transistor Q1 is connected on the one hand to the point 23 through the resistor R3, and on the other hand to the base of the transistor Q2. The emitter is connected to the point 13 through the emitter resistor R4. The collector of the transistor Q2 is connected on the one hand to the point 23 via the resistor R5, on the other hand to the base of the transistor Q3. The emitter is connected to the point 13 via the resistor R6. Between the emitter of the transistor Q3 and the emitter of the transistor Q1 there is a negative feedback circuit comprising the resistor R9. This resistor has been shown located outside the monolitic circuit to make it possible to adjust the desired amplification. The resistor R8 can for example be of the thick film type which after the production is trimmed to the desired value, for example by abrading.

Figure 2:
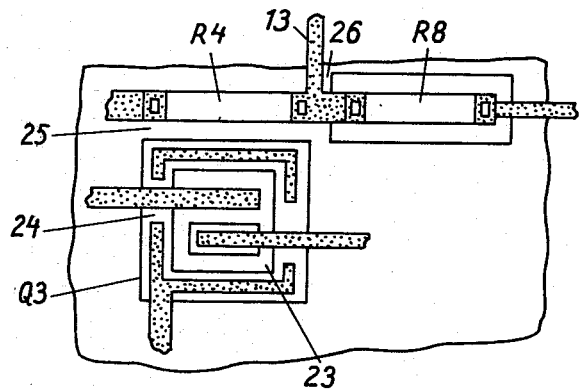
FIG. 2 shows a plane view of a detail of an integrated circuit according to FIG. 1.
Figure 3:
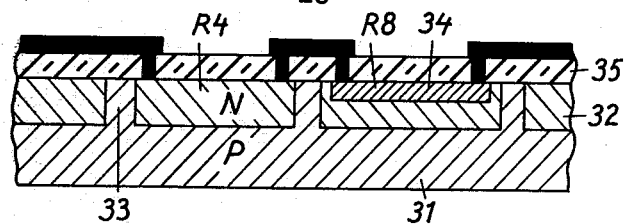
FIG. 3 shows a section through the detail according to FIG. 2.

All the resistors of the monolitic circuit except resistor R4 are formed in the semi-conductor body simultaneously with base diffusion. In normal processes these resistors acquire a surface resistance of the magnitude 150 Ω ohms/square and a temperature coefficient + 0.1%/° C. The resistor R4 is on the contrary formed in the layer forming the collectors of the transistors of the circuit. This layer has a volume resistivity of 0.5–1 ohm cm and a temperature coefficient + 3.5%/° C. The resistor R4 is physically so placed in the integrated circuit that it has a good thermal coupling with the output transistor Q3, but is electrically insulated from transistor Q3. This appears more in detail from FIGS. 2 and 3. The integrated circuit is built on a substrate 31 of P-conducting silicon. On this substrate an epitaxial layer 32 of N-conducting silicon has been deposited which for example forms the collector 24 in the transistor Q3 and the resistor R4. By means of P-diffusion insulating areas 33 are formed in the N-conducting layer 32 between the components or the component groups. Such an insulation area 25 separates for example the transistor Q3 from the resistor R4 while area 26 separates the resistors R4 and R8. In the N-layer there is further diffused P-areas 34 which form the base layer 23 in the transistors and all the resistors except resistor R4. The circuit is protected in usual manner with an oxide layer 35, in which windows are opened for contacts with the interconnection pattern applied on the oxide layer.

If the voltage on the line La, Lb for example increases, the operating point of the input transistor Q1 will be shifted in the positive direction causing its quiescent current to increase. Accordingly the current in the final transistor also increases. The heating caused by this current increase is transferred to the resistor R4 with a delay which is determined by the thermal qualities of the semi-conductor chip and the distance between the resistor and the transistor Q3. When the resistor R4 is heated its resistance increases more than other resistances in the circuit which have a lower temperature coefficient. The feedback ratio R4/R9 will therefore increase and the negative feedback of the DC voltage as well as the AC signals increase. The operating point of the amplifier is stabilized and the actual gain is adjusted to the lower level which is sufficient for the lower line impedance causing the current increase. Inversely, if the amplifier is connected to a line with a high line impedance, the gain will increase correspondingly.

Figure 4:
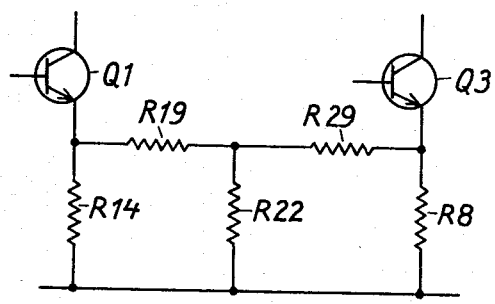
FIG. 4 shows a modification of the negative feedback circuit shown in FIG. 1.

By dividing up the voltage divider in two links included in the feedback network R9, R4, as is shown in FIG. 4 it is possible to multiply the thermally controlled feedback. The resistors R19 and R29 have a temperature coefficient while resistors R14 and R24 have a high positive temperature coefficient caused by the fact that they are placed in the collector diffusion. If the desired voltage ratio for example is 100:1 each link comprising resistors R19, R14 and R29, R24 may have an attenuation of 10:1. The sum of the resistances or resistors R29, R24 is suitably larger than that of resistor R14. The attenuation of the total voltage divider chain now gets a temperature coefficient which is about twice as large as for a voltage divider where the whole attenuation is located to one L-link only. This improvement is obtained, however, at the price of two further components. However, when the lay-out of the circuit is suitable only a minor increase of the substrate surface for the circuit is required. The showed microphone amplifier is only one embodiment of the invention. Especially within telephony there are several other amplifier applications where the same system for automatic adapting of the gain within a monolitic circuit to the line current is applied with advantage. For example, the invention can be used with key operated telephone sets which often comprise a tone-frequency oscillator circuit with amplifiers for the tone signals generated by the oscillator circuit.

A further application is for amplifiers for receiving the tone-signals from the subscribers of key operated telephone sets. These receivers, which are placed in the telephone exchange, can employ the invention in order to equalize the received signal level which varies with the resistance in the subscriber's line.

We claim:

1. In an integrated amplifier comprising an output transistor stage connected to a pair of terminals for simultaneously receiving DC operating currents and transmitting AC signals and at least one other transistor amplifier stage formed on a silicon monolithic chip and at least one negative feedback network coupled between said output transistor amplifier stage and said other transistor amplifier stage, the elements of said network including resistors at least partly formed on the silicon monolithic chip, characterized in that at least one resistor included in the negative feedback network has a temperature coefficient which is greater than the temperature coefficient of the other resistors in the negative feedback network, and in that said one resistor is situated on the monolithic chip geometrically adjacent but not in contact with said output transistor amplifier stage so that the amount of negative feedback is dependent on the amount of heating of the monolithic chip in the region of said output transistor stage caused by the amplitude of the operating current passing through said output transistor amplifier.

2. An integrated amplifier according to claim 1, wherein said first resistor has a positive temperature coefficient which is greater than the temperature coefficient of the other resistors.

3. An integrated circuit according to claim 2 wherein said first resistor is formed in the collector diffusion layer of the monolithic circuit.

4. An integrated amplifier according to claim 1 wherein the negative feedback network comprises at least one voltage divider circuit.

5. An integrated circuit according to claim 4 wherein the negative feedback network comprises a plurality of cascaded voltage dividers, each of said voltage dividers including temperature dependent resistors.

6. An integrated circuit according to claim 4, wherein said one resistor is in the emitter circuit of said other transistor amplifier stage.

7. A variable gain signal amplifier comprising: first and second solid state signal amplifiers on a monolithic chip, each amplifier having input, output and reference electrodes, first and second transfer terminals, connected to the input and reference electrodes, respectively, of said second solid state signal amplifier for transferring signal therefrom and also being adapted to receive operating current for said amplifiers; means on said monolithic chip for connecting said output and reference electrodes of said first solid state signal amplifier to said first and second transfer terminals, respectively; means for applying an AC signal across the input and reference electrodes of said first solid state signal amplifier; means on said monolithic chip for connecting the output electrode of said first solid state signal amplifier to the input electrode of said second solid state signal amplifier; and temperature sensitive resistive negative feedback means connected from an electrode of said second solid state signal amplifier to an electrode of said first solid state signal amplifier for feeding signals from said second solid state signal amplifier to said first solid state signal amplifier.

8. The variable gain signal amplifier of claim 7 wherein said temperature sensitive resistive negative feedback means comprises a temperature sensitive resistor on said monolithic chip with a positive temperature coefficient connected between the reference electrode of said second solid state amplifier and said second transfer terminal, and another resistor interconnecting the reference electrodes of said solid state amplifiers.

9. The variable gain signal amplifier of claim 7 wherein said other resistor is external to said monolithic chip so that it can be manually changed.

10. The variable gain signal amplifier of claim 7 wherein said means for applying AC signals is a pair of input terminals on the monolithic chip and a microphone external to the monolithic chip and connected to said pair of input terminals.

* * * * *